United States Patent [19]
Fletcher et al.

[11] 3,984,256
[45] Oct. 5, 1976

[54] PHOTOVOLTAIC CELL ARRAY

[76] Inventors: James C. Fletcher, Administrator of the National Aeronautics and Space Administration, with respect to an invention of; Jon T. Eliason, Huntsville, Ala.

[22] Filed: Apr. 25, 1975

[21] Appl. No.: 571,458

[52] U.S. Cl. .................................. 136/89; 29/572
[51] Int. Cl.² ....................................... H01L 31/04
[58] Field of Search ...................... 136/89; 357/30

[56] References Cited
UNITED STATES PATENTS

| | | | |
|---|---|---|---|
| 2,402,662 | 6/1946 | Ohl | 136/89 |
| 3,069,487 | 12/1962 | Strother | 136/89 |
| 3,134,906 | 5/1964 | Henker | 136/89 |
| 3,171,068 | 2/1965 | Denkewalter et al. | 136/89 X |
| 3,206,832 | 9/1965 | Strother | 136/89 X |
| 3,453,352 | 7/1969 | Goundry | 264/93 |
| 3,483,038 | 12/1969 | Hui et al. | 136/89 |

*Primary Examiner*—John H. Mack
*Assistant Examiner*—Aaron Weisstuch
*Attorney, Agent, or Firm*—L. D. Wofford, Jr.; G. J. Porter; John R. Manning

[57] ABSTRACT

A photovoltaic cell array consisting of parallel columns of silicon filaments, each being doped to produce an inner region of one polarity type and an outer region of an opposite polarity type to thereby form a continuous radial semi-conductor junction. Spaced rows of electrical contacts alternately connect to the inner and outer regions to provide a plurality of electrical outputs which may be combined in parallel or in series.

6 Claims, 4 Drawing Figures

PHOTOVOLTAIC CELL ARRAY

ORIGIN OF THE INVENTION

The invention described herein was made in the performance of work under a NASA contract and is subject to the provisions of Section 305 of the National Aeronautics and Space Act of 1958, Public Law 85–568 (72 stat. 435; 42 U.S.C. 2457).

BACKGROUND OF THE INVENTION

1. Field of the Invention

This invention relates to photovoltaic cells, and particularly to a matrix connected arrangement of such cells and electrical output leads.

2. General Description of the Prior Art

The use of photovoltaic cells for the production of power is clearly in its infancy. While the general principles are well known and have been for many years, the fact remains that there is still not available an economical form of photovoltaic device capable of competitively providing power for household or industrial use. The difficulty has been that thousands or hundreds of thousands of cells are necessary to produce sufficient power, and the cost per unit has simply been prohibitive.

It is, accordingly, the object and purpose of this invention to overcome this handicap and to enable the production in a single unitary structure of an almost limitless number of photovoltaic cells at a small fraction of the cost of manufacture heretofore experienced.

SUMMARY OF THE INVENTION

In accordance with the invention, a photovoltaic cell array is constructed of a combination of parallel columns of P and N doped semi-conductor fibers and parallel rows of positive and negative electrical contact members extending across and making contact with the respective P and N doped regions of the semi conductor fiber columns. There is thus formed an array of photovoltaic cells and electrical outputs from the cells may be combined in series or parallel arrangements by appropriate connection to the contact members to provide a desired voltage-current output.

DETAILED DESCRIPTION OF THE DRAWINGS

Figure 1:
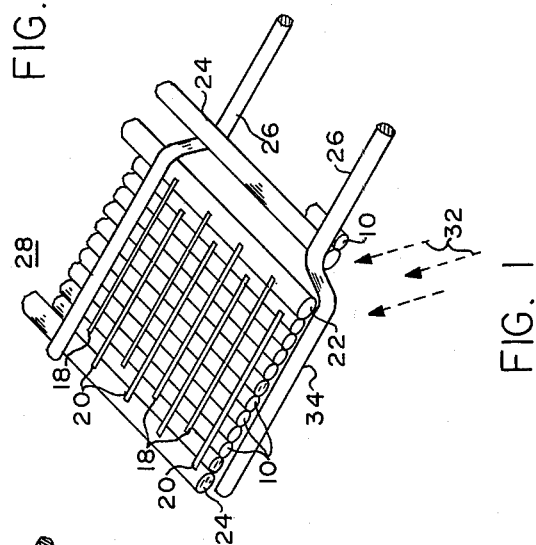
FIG. 1 is a pictoral view of an embodiment of the invention.
Figure 2:
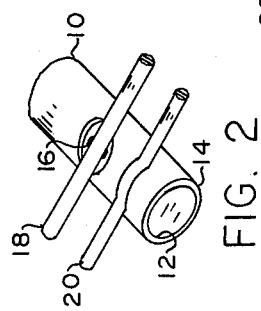
FIG. 2 is an enlarged pictoral view of a portion of FIG. 1 illustrating certain details of construction.

Referring initially to FIGS. 1 and 2, the present invention contemplates the construction of photovoltaic units from filaments 10 of silicon having a diameter typically of 0.001 to 0.010 inch. Each filament 10 is initially doped to produce a P-type conductivity internal region 12, and therafter an opposite conductivity type doping is applied, as by diffusion, to the outer surface 14 of the filament to produce an N-type conductivity layer. It will be apparent to those skilled in the art that the body of the filament may be doped N-type and the outer portion doped P-type instead of the above manner, chosen for illustration. The P doping is conveniently achieved by means of boron, and the N doping is achieved by means of phosphorus. A portion of the N-type layer is removed at spaced points, as for example by etching, to expose P material regions 16. An ohmic contact is then made to the P material region by P contact member 18, as by diffusing bonding or welding.

N contact member 20 is welded to filament 10 at a spacing typically of 0.020 to 0.200 inch from the nearest contact member 18 to thereby provide one photovoltaic cell unit with an output available between a contact member 18 and contact member 20. U.S. Pat. No. 3,453,352 generally describes the method of construction of lengths of small cross section semi-conductor material.

Figure 3:
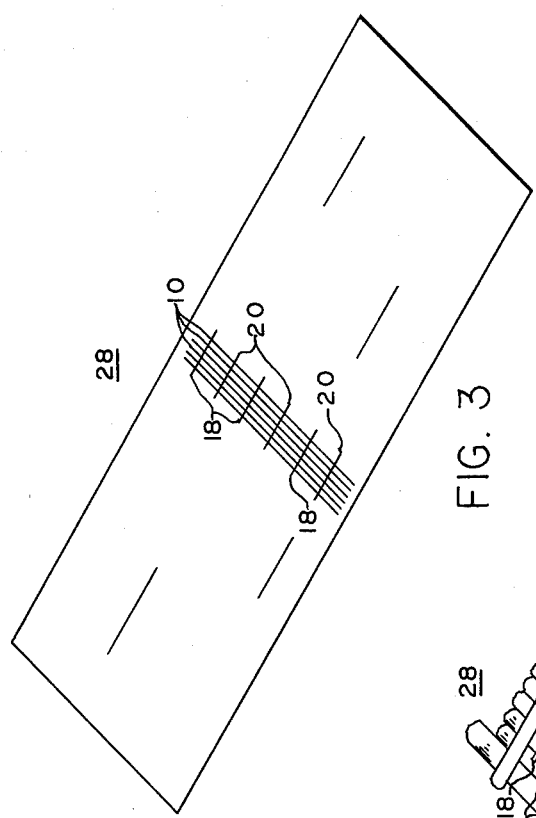
FIG. 3 is a schematic illustration of the arrangement of the components of the invention in the form of a fiber blanket.

As shown in FIG. 1, the photocell units thus connected are connected in parallel, with contact members 18 being connected to P bus 22 and N contact members 20 connected to N bus 24. The structure is supported by insulating fibers 26, which enable the construction of large area arrays consisting of series and parallel electrical interconnected units of the above type, as represented by solar cell blanket 28, shown in FIG. 3. By this technique, photovoltaic cell densities of 100 to 1,000 per square inch may be achieved.

In operation, array 28 would be positioned so that radiation 32 from the sun would strike the underside 34 of the array, and each filament would produce multiple outputs to buses 22 and 24.

Figure 4:
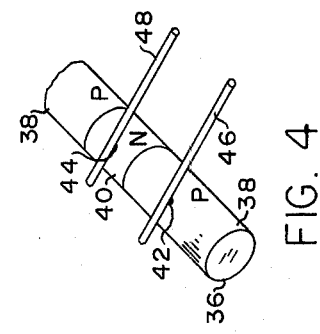
FIG. 4 is a pictoral view and alternate embodiment of the invention.

FIG. 4 illustrates an alternate form of the invention wherein instead of there being radially formed junctions in the filaments of silicon, filament 36 is formed with alternately doped P and N regions 38 and 40 along the length of each filament. In such case, ohmic connections 42 and 44 are made to electrical output contact members 46 and 48 which may be made by surface welding of the contact members to each filament 36.

From the foregoing, it will be appreciated that this invention provides a solution to the problem of the high costs of making solar cells, by weaving or otherwise positioning in a parallel, planar fashion filaments made of doped silicon fibers with diffused radial or axial junctions. Each solar cell unit may be connected in series with others by means of interconnection wires or attached wire mesh screens. Cells may be made larger or smaller by making the grid electrodes in different ways, "weaving" suitable wires among the silicon filaments to act as buses, and by varying the dimension of the structure. The silicon filaments are flexible and of high strength, hence can be wound on drums for storage in either filament or "blanket" form. Because of the high strength of and small size of the fiber, an array will provide a high redundancy factor. By using resistance heating, or lasers for heating, or RF induction heating, the formation of arrays in flexible blanket form can be automated. Individual cells may be electrically isolated in the blanket through the use of fibers woven in the flanket (as shown) or by means of insulating coatings or by the relative high resistance inherent along the length of a silicon filament. Because of the small diameter of a filament, and with localized laser processing and heating, the time of contact between a hot filament and any supporting structure, such as a processing fixture, can be quite effectively reduced with a consequent minimization of contamination.

Where junctions are exposed by virtue of the removal of material, they would be subsequently treated to prevent exposure by a technique usually referred to as passivation.

What is claimed is:

1. A photovoltaic cell array comprising:
   a plurality of elongated, spaced filaments of semi-conductor material, each filament being doped to have spaced regions of opposite polarity type;
   a first plurality of spaced rows of electrical conductors overlying said semi-conductor filaments, and each row being in electriclal contact with one polarity region of each said filament;
   a second plurality of spaced rows of electrical conductors overlying said filaments and disposed intermediate to said first-named row and being in electrical contact with opposite polarity regions of said filaments; and
   a first polarity current collecting means connected to said first plurality of electrical conductors, and second current collecting means connected to said second plurality of electrical conductors.

2. A photovoltaic cell array as set forth in claim 1 wherein said semiconductor material is silicon.

3. A photovoltaic cell array as set forth in claim 2 wherein the doping of a said filament is axially spaced to provide alternate P and N regions along the filament.

4. a photovoltaic cell array as set forth in claim 2 wherein the doping is radially spaced to provide an internal doped region of one polarity and an outer doped region of an opposite polarity.

5. A photovoltaic cell array comprising:
   a plurality of elongated, spaced filaments, each filament comprising a semi-conductor material having impurities fused therein to form a diffused radial P-N junction wherein the interior region of each said filament is of one polarity and the outer region of each said filament is of an opposite polarity, a portion of surface being removed at spaced points along each said filament, thereby exposing said interior region;
   a first set of spaced contact members, said members overlying said filaments, and each said lead being an ohmic electrical contact with a row of said exposed inner regions of said plurality of filaments;
   a second set of spaced contact members overlying said filaments and disposed intermediate first set of contact members, each of said second set of contact members being in ohmic electrical contact with a row of said outer regions of said filaments; and
   a first current collector bus connected to said first set of contact members, and a second current collecting bus connected to said second set of contact members, whereby the power output of said array is available from said current collector buses.

6. A photovoltaic cell array as set forth in claim 5 wherein said interior region is of a P polarity and said outer region is of an N polarity.

* * * * *